United States Patent [19]

Sanchez et al.

[11] Patent Number: 5,899,707
[45] Date of Patent: May 4, 1999

[54] METHOD FOR MAKING DOPED ANTIFUSE STRUCTURES

[75] Inventors: Ivan Sanchez; Landon B. Vines, both of San Antonio, Tex.

[73] Assignee: VLSI Technology, Inc., San Jose, Calif.

[21] Appl. No.: 08/699,866

[22] Filed: Aug. 20, 1996

[51] Int. Cl.[6] .................................................. H01L 21/82
[52] U.S. Cl. ........................ 438/131; 438/600; 438/467
[58] Field of Search .................................. 438/131, 600, 438/467

[56] References Cited

U.S. PATENT DOCUMENTS

| | | | |
|---|---|---|---|
| 4,174,521 | 11/1979 | Neale | 357/45 |
| 4,420,766 | 12/1983 | Kasten | 357/59 |
| 4,441,167 | 4/1984 | Principi | 365/94 |
| 4,538,167 | 8/1985 | Yoshino et al. | 357/59 |
| 4,569,120 | 2/1986 | Stacy et al. | 29/574 |
| 4,569,121 | 2/1986 | Lim et al. | 29/574 |
| 5,070,384 | 12/1991 | McCollum et al. | 357/51 |
| 5,095,362 | 3/1992 | Roesner | 357/23.4 |
| 5,106,773 | 4/1992 | Chen et al. | 437/51 |
| 5,120,679 | 6/1992 | Boardman et al. | 437/195 |
| 5,191,241 | 3/1993 | McCollum et al. | 307/465 |
| 5,210,598 | 5/1993 | Nakazaki et al. | 257/530 |
| 5,233,206 | 8/1993 | Lee et al. | 257/50 |
| 5,248,632 | 9/1993 | Tung et al. | 437/195 |
| 5,258,891 | 11/1993 | Sako | 361/792 |
| 5,266,829 | 11/1993 | Hamdy et al. | 257/530 |
| 5,272,666 | 12/1993 | Tsang et al. | 365/96 |
| 5,290,734 | 3/1994 | Boardman et al. | 437/195 |
| 5,293,133 | 3/1994 | Birkner et al. | 324/713 |
| 5,300,456 | 4/1994 | Tigelaar et al. | 257/530 |
| 5,328,868 | 7/1994 | Conti et al. | 437/203 |
| 5,329,153 | 7/1994 | Dixit | 257/530 |
| 5,373,169 | 12/1994 | McCollum et al. | 257/50 |
| 5,381,035 | 1/1995 | Chen et al. | 257/530 |
| 5,464,790 | 11/1995 | Hawley | 257/530 |
| 5,482,884 | 1/1996 | McCollum et al. | 438/131 |
| 5,489,796 | 2/1996 | Harward | 257/379 |
| 5,493,144 | 2/1996 | Bryant et al. | 257/530 |
| 5,493,146 | 2/1996 | Pramanik et al. | 257/530 |
| 5,502,315 | 3/1996 | Chua et al. | 257/50 |
| 5,557,136 | 9/1996 | Gordon et al. | 257/530 |
| 5,593,920 | 1/1997 | Haslam et al. | 257/530 |

FOREIGN PATENT DOCUMENTS

| | | | |
|---|---|---|---|
| 0 455 414 A1 | 6/1991 | European Pat. Off. | H01L 23/525 |
| WO 93/04499 | 4/1993 | European Pat. Off. | H01L 21/70 |

OTHER PUBLICATIONS

K.E. Gordon and R.J. Wong, "Conducting Filament of the Programmed Metal Electrode Amorphous Silicon Antifuse," QuickLogic Corp., Santa Clara, CA, 1993 IEEE, International Electron Devices Meeting, Dec. 5–8, 1993, Washington, DC.

Unknown, "Developments in non–volatile FPGAs," Electronic Engineering, Apr. 1993.

Primary Examiner—John F. Niebling
Assistant Examiner—Lynne A. Gurley
Attorney, Agent, or Firm—Martine Penilla & Kim, LLP

[57] ABSTRACT

An antifuse structure and method for making the antifuse structure having a doped antifuse layer is disclosed. The doped antifuse layer is preferably deposited over a lower electrode. A barrier layer may then be formed over the doped antifuse layer and an upper electrode may subsequently be deposited over the barrier layer. The method of depositing the doped antifuse layer includes: (a) providing a chemical vapor deposition reactor having a support chuck for supporting a partially fabricated silicon wafer; (b) powering up the chemical vapor deposition reactor and heating the partially fabricated silicon wafer; (c) selecting a dopant species for the antifuse layer (e.g., n-type or p-type); (d) introducing a gaseous mixture of a silane compound and the selected dopant species into the chemical vapor deposition reactor with the aid of a neutral species; and (e) depositing the antifuse layer over the lower electrode. When the antifuse structure is programmed, a wider conduction path is formed in the doped antifuse layer and deprogrammed states are prevented.

31 Claims, 5 Drawing Sheets

METHOD FOR MAKING DOPED ANTIFUSE STRUCTURES

CROSS REFERENCE TO RELATED APPLICATIONS

This application is related to the following U.S. patent application Ser. No. 08/699,867 (attorney docket no. VTI1P152/2446) filed on the same day as the instant application, and Koucheng Wu, Ivan Sanchez, Yu-Pin Han and Ying-Tsong Loh as inventors, and entitled Method and Apparatus for Programming Antifuse Structures. This application is hereby incorporated by reference.

BACKGROUND OF THE INVENTION

The present invention relates generally to integrated circuit (IC) chips, and more particularly, to improved antifuse structures and methods for depositing antifuse layers to prevent deprogramming failures.

Fuse and antifuse structures have been used for sometime in certain classes of IC chips such as field programmable gate arrays, programmable read-only memories (PROMs) and the like. Field programmable gate arrays include a large number of logic elements, such as AND gates and OR gates, which can be selectively coupled together by means of fuses or antifuses to perform user designed functions. An unprogrammed fuse-type gate array is programmed by selectively blowing fuses within the device, while an unprogrammed antifuse type gate array is programmed by causing selected antifuses to become conductive.

There are many types of PROMs including standard, write-once PROMs, erasable programmable read-only memories (EPROMs), electrically erasable programmable read-only memories (EEPROMs), etc. A PROM usually comprises an array of memory cells arranged in rows and columns, which can be programmed to store user data.

Fuses for field programmable gate arrays, PROMs and the like are typically made from a titanium-tungsten (TiW) alloy and are shaped somewhat like a bow-tie having a narrow, central neck and wide ends. The neck of the fuse is typically about 2 microns wide, while the ends of the fuse are typically about 6 microns wide. When a sufficiently high voltage (usually on the order of 10 volts D.C.) is applied to the fuse, the current flowing through the fuse will cause it to heat-up and will eventually melt the fuse at its neck, thereby "blowing" the fuse. Fuses in electronic devices are much more prevalent today than antifuses because they are easier to manufacture and have a better record of reliability.

Antifuses, however, do have the very desirable feature of being small in size. For example, a TiW fuse with a 2 micron neck and 6 micron end width permits approximately 4,000 fuses to be provided on a typical device. In contrast, a 1 or 1.2 micron diameter antifuse via permits 80,000–100,000 antifuses to be formed on a single device. As a result, antifuses provide designers with the ability to form larger numbers of antifuses for storing information on a typical devices than fuse technology storage.

Antifuse structures include a material which initially has a high resistance but which can be converted into a low resistance material by the application of a programming voltage. Once programmed, these low resistance antifuse structures can couple together logic elements of a field programmable gate array so that the gate array will perform user-desired functions, or can serve as memory cells of a PROM.

To facilitate further discussion, FIG. 1 schematically illustrates a cross section of a prior art antifuse structure 10.

Antifuse structure 10 includes a "metal-one" layer 14, which is typically formed over an oxide layer of a semiconductor substrate, e.g., the silicon dioxide layer of a silicon wafer. Metal-one layer 14 typically comprises titanium-tungsten and/or other suitable conductive materials and may be formed by a conventional physical vapor deposition (PVD) process, such as sputtering.

Once metal-one layer 14 is formed, an antifuse layer 16 is blanket deposited and patterned using a suitable photo-lithographic process. Antifuse layer 16 is formed from amorphous silicon (a-Si), which has an intrinsic resistivity of approximately one mega-ohm-cm, and which may be deposited by any number of conventional processes, including chemical vapor deposition (CVD).

Following the amorphous silicon deposition, a barrier layer 17 is blanket deposited over antifuse layer 16. By way of example, barrier layer 17 may be a titanium-tungsten (TiW) layer configured to prevent aluminum atoms of subsequently deposited metallization layers from diffusing into and degrading antifuse layer 16. Next, an intermetal oxide (IMO) layer 18, typically consisting of silicon dioxide, is deposited above barrier layer 17 using any well-known process. A via hole 20 is then etched, using a suitable photolithographic process and an appropriate etchant. The via hole 20 therefore extends through inter-metal oxide layer 18 and stops at about barrier layer 17. A "metal-two" layer 22 then fills via hole 20 to create a metal contact to barrier layer 17 through inter-metal oxide layer 18.

The antifuse structure of FIG. 1 can then be programmed by applying an appropriate programming voltage between metal-one layer 14 and metal-two layer 22. For a typical amorphous silicon-based antifuse, the programming voltage is, for example, between about 8–12 volts D.C. at about 10 milli-amps (mA). During the programming step, antifuse layer 16 will typically form a conductive filament 24. Conductive filament 24 is generally formed when conductive atoms from metal-one layer 14 and/or conductive barrier layer 17 migrate into antifuse layer 16. A description of conducting filaments in programmed antifuse devices is found in a paper entitled "Conducting Filament of the Programmed Metal Electrode Amorphous Silicon Antifuse," Gordon et al., IEDM Tech. Dig., p. 27, December 1993, incorporated herein by reference.

A typical amorphous silicon-based antifuse structure 10 typically having a resistance of about 1–2 giga-ohms before programming (e.g., for a one micron diameter antifuse structure). After being programmed, the same antifuse structure 10 may have a resistance of about 20 to 100 ohms.

A problem often encountered with conventional antifuses is known as "deprogramming" (also referred to as infant mortality failures), in which antifuses having been subjected to a programming voltage are later found to have reverted to an unprogrammed "off" state. In some cases, deprogramming is a result of weakly "programmed" antifuse which initially forms an inadequate conductive filament. By way of example, antifuses with inadequate filament formation typically increase in resistance over time and essentially become unprogrammed as opposed to remaining in a low resistive state. Deprogramming problems may also result in programmed IC chip failures or latent defects that could potentially result in exceedingly expensive unsuspected future malfunctions.

In view of the forgoing, what is needed is a method for manufacturing amorphous silicon antifuse structures that maintain their programmed status thereby preventing infant mortality failures.

SUMMARY OF THE INVENTION

The present invention discloses an antifuse structure and method for making an antifuse structure having a doped antifuse layer which when programmed maintains its programmed status over time due to a wider conduction path facilitated by the doped antifuse layer. The antifuse structure includes a doped antifuse layer that is preferably deposited over a lower electrode. A barrier layer is then preferably formed over the doped antifuse layer and an upper electrode is optimally deposited over the barrier layer. In one embodiment, the method of depositing the doped antifuse layer includes: (a) providing a chemical vapor deposition reactor having a support for securing a partially fabricated silicon wafer; (b) powering up the chemical vapor deposition reactor and heating the partially fabricated silicon wafer; (c) selecting a dopant species for the antifuse layer as either n-type or p-type; (d) introducing a gaseous mixture of a silane compound and the selected dopant species into the chemical vapor deposition reactor with the aid of a neutral species; and (e) depositing the antifuse layer over the lower electrode.

Depositing the doped antifuse layer in accordance with this invention beneficially eliminates the need for additional high energy "ion-implantation" steps which conventionally require further processing and may increase cost and reduce throughput.

In another embodiment, an antifuse structure formed over a semiconductor substrate is disclosed. The structure includes: (a) a bottom electrode layer; (b) a doped amorphous silicon layer disposed above the bottom electrode layer, the doped amorphous silicon layer having a first resistance value when the antifuse structure is unprogrammed and a second resistance value lower than the first resistance value when the antifuse structure is programmed; (c) a barrier layer disposed above the doped amorphous silicon layer; (d) an inter-metal oxide layer disposed above the barrier layer, the inter-metal oxide layer having a via hole extending through the inter-metal oxide layer and leading to the barrier layer; (e) a top electrode layer disposed above the inter-metal oxide layer, a portion of the top electrode layer being in electrical contact with the barrier layer through the via hole that extends through the inter-metal oxide layer; and (f) a potential linking area disposed in the doped amorphous silicon layer and being substantially vertically aligned with the via hole, the potential linking area having a reduced resistance due to a migration of atoms from one or both of the barrier layer and the top electrode layer when a programming voltage is applied between the bottom electrode layer and the top electrode layer.

Another advantage is that time consuming "ion-implantation" steps are avoided since the amorphous silicon layer is deposited as a "doped" amorphous silicon layer. These and other advantages of the present invention will become apparent upon reading the following detailed descriptions and studying the various figures of the drawings.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

Figure 1:
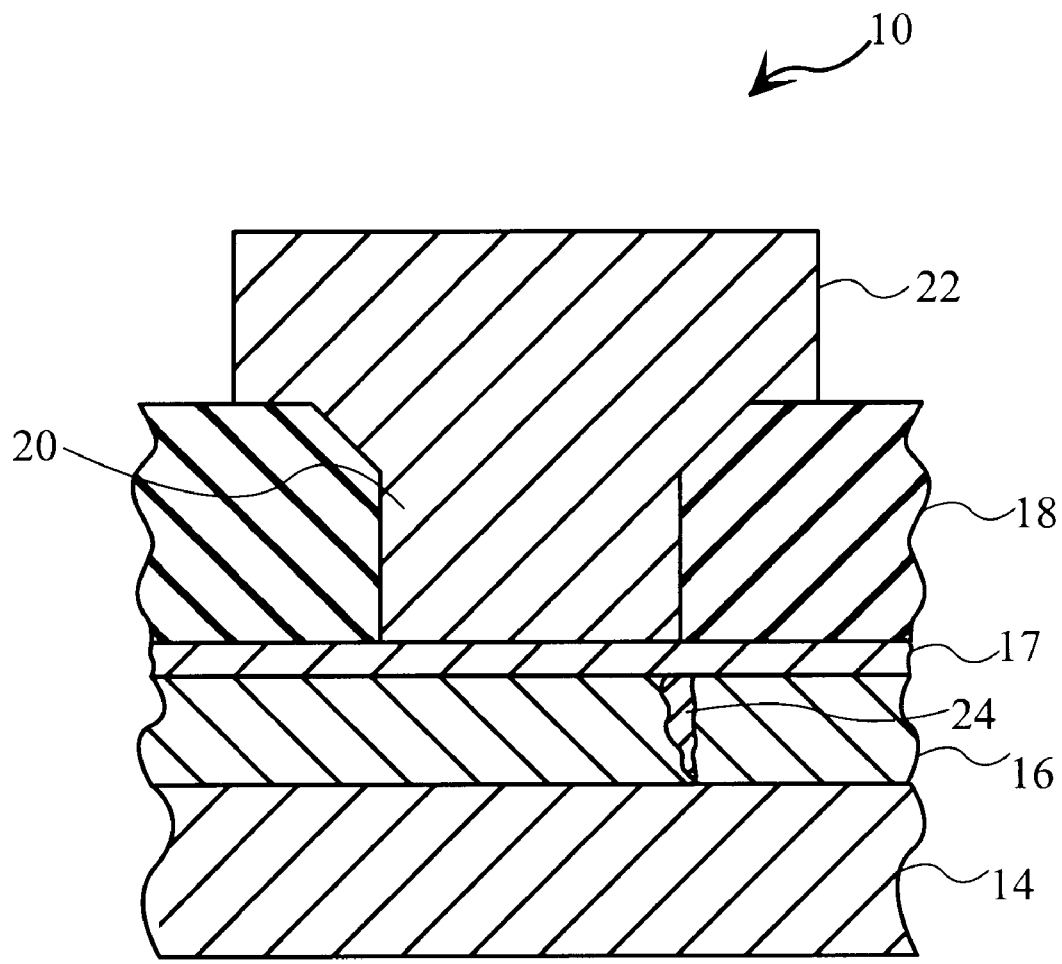
FIG. 1 is a cross sectional view of a prior art antifuse structure and a conductive filament formed after programming.

FIG. 1 is a cross-sectional view of a prior art antifuse structure having a single antifuse conductive path which was discussed with reference to the prior art.

One embodiment of the present invention is directed at an antifuse structure and method for making the antifuse structure having a doped antifuse layer. The antifuse structure is formed over a suitable semiconductor substrate that may be provided in wafer form. In this preferred embodiment, the semiconductor substrate is a silicon wafer having a diameter in the range of between about 2 and 12 inches, and more preferably between about 4 and 8 inches, although the substrate can be of any practiced size. Of course, the particular processing parameters that will be described below may be adjusted to accommodate other substrates having different chemical compositions or geometrical shapes and sizes.

The antifuse structure preferably has a bottom electrode (e.g., "metal-one layer") formed over a thin oxide layer. The bottom electrode is preferably formed by a conventional physical vapor deposition (PVD) process, such as sputtering. Once the bottom electrode is formed, the silicon wafer is placed into a chemical vapor deposition (CVD) chamber in order to deposit an antifuse layer. Preferably, the deposition chamber is a plasma enhanced chemical vapor deposition (PECVD) chamber. The chamber is then "powered up" to between about 70 and 150 watts, and gaseous mixtures are allowed to flown into the chamber through a conduit network coupled to the deposition chamber. The gaseous mixture are selected such that a doped amorphous silicon layer is formed over the bottom electrode.

It should be appreciated that the doped amorphous silicon layer is advantageously formed in one step without requiring additional ion implantation steps. Once the doped amorphous silicon layer is formed, the silicon substrate is removed form the CVD chamber to enable the deposition of a barrier layer (e.g., TiW) over the antifuse layer. In this manner, the antifuse layer is protected from subsequent via hole etching steps. Next, an intermediate oxide dielectric layer is formed over the antifuse layer and a via hole etched through the inter-mediate dielectric layer. Finally, in this embodiment, a top electrode is formed over the inter-mediate dielectric layer such that the top electrode material conformally fills the via hole. The various embodiments of the present invention will now be described in greater detail with reference to FIGS. 2 through 5 below.

Figure 2:
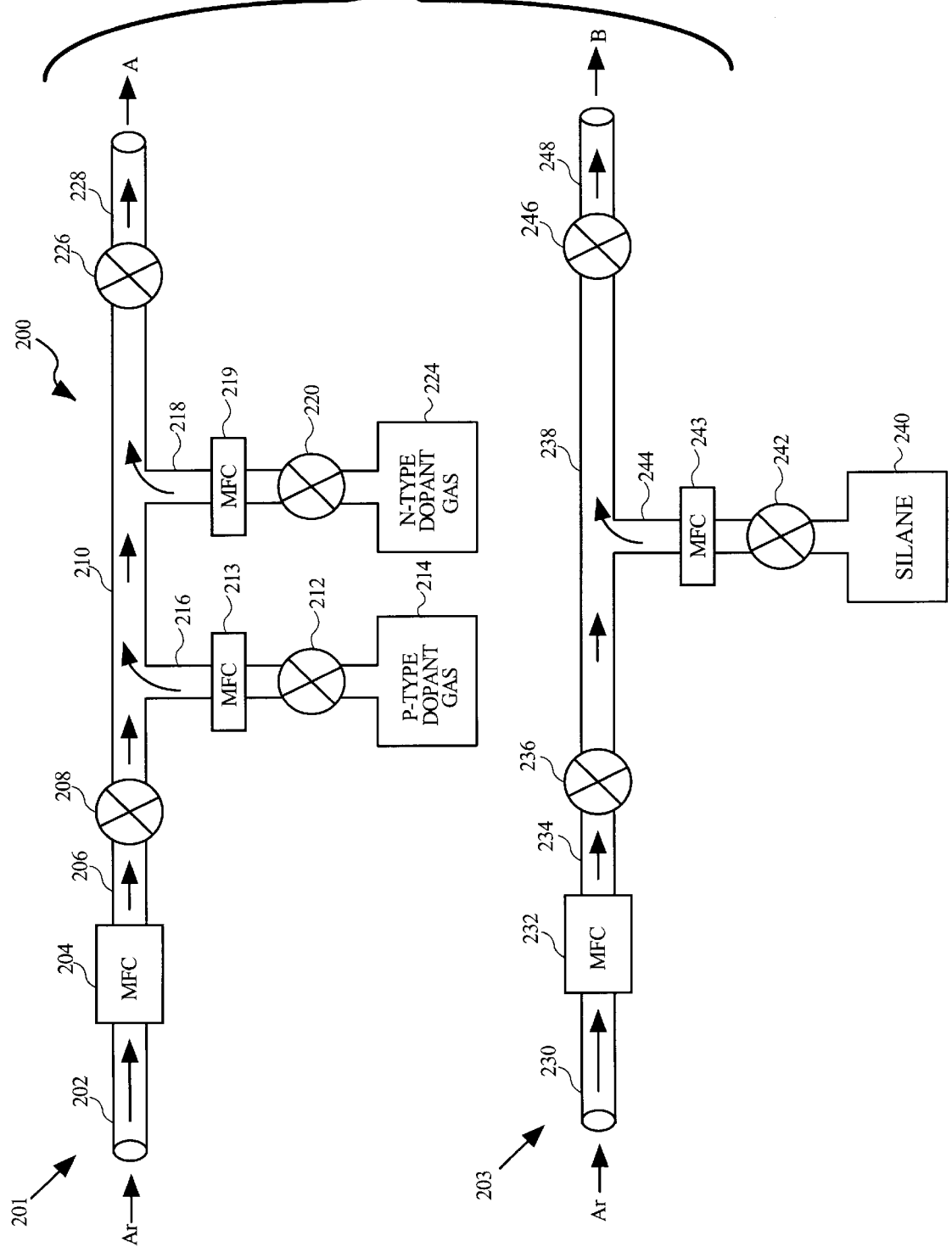
FIG. 2 is a gas conduit network implemented to feed various gaseous reactants into a reaction chamber for depositing a doped amorphous silicon antifuse layer in accordance with a preferred embodiment of this invention.

FIG. 2 illustrates a gaseous conduit supply network 200 implemented to feed various gaseous reactants into a CVD reaction chamber for depositing a doped amorphous silicon layer. In the embodiment illustrated, a first conduit network 201 is provided to supply dopant gasses into a PECVD reaction chamber. In this embodiment, argon (Ar) gas is fed into a conduit segment 202 which is coupled to a mass flow controller 204 which is configured to moderate the flow rate of the argon gas being fed into a conduit segment 206. When the argon gas is allowed to flow into a conduit segment 206, the argon gas will reach a valve 208 which is used to control the conduction and suspension of the gaseous argon flow.

First conduit network 201 also includes a p-type dopant gas source 214 and an n-type dopant gas source 224 that are fluidly coupled to a conduit segment 210. If a p-doped (i.e., electron deficient) amorphous silicon layer is desired, a valve 212 will be allowed to conduct p-type dopant gas from source 214 into a mass flow controller 213 which leads to a conduit segment 216 and is coupled to conduit segment 210. The p-type dopant gas can be any suitable dopant gas which is introduced into a deposition chamber. By way of example, suitable p-type dopant gases include diborane ($B_2H_6$) and a $BF_2$ gaseous compound.

At this stage, the argon gas is allowed to pass through valve 208 and into conduit segment 210 thereby allowing the argon gas to mix with the p-type dopant gas before reaching valve 226. When conduction is facilitated by valve 226, the gaseous mixture then flows into a conduit segment 228 which leads to an outlet A that may be coupled to a reaction chamber that will be described with reference to FIG. 3.

Alternatively, if an n-doped (i.e., electron rich) amorphous silicon layer is desired, valve 212 will be fixed in a non-conducting state and the mass flow controller 213 will suspend conduction. Next, a valve 220 will be allowed to conduct and a mass flow controller 219 will supply an n-type dopant gas from source 224 into a conduit segment 218, which leads to conduit segment 210. The n-type dopant gas can be any suitable dopant gas which may be introduced into a deposition chamber. By way of example, the n-type dopant gas be a phosphene ($PH_3$) gaseous compound or Arsine. As described above, argon gas may then be allowed to conduct through valve 208 which leads to conduit segment 210. In this manner, a gaseous mixture of n-type dopant gas and argon will be allowed to follow to valve 226. Once valve 226 is allowed to conduct, the gaseous mixture then enters conduit segment 228 which leads to outlet A which is coupled to a reactor chamber as described above.

It should be apparent to those skilled in the art that although diborane gas was used to introduce p-type impurities and phosphene was used to introduce n-type impurities into the reaction chamber, other suitable dopant compounds as noted above maybe substituted therefor. Further, it should be understood that other inert carrier gases, such as nitrogen ($N_2$), helium (He), an argon/helium mixture (Ar/He), can be substituted or added to the argon inert carrier gas noted above.

Still referring to FIG. 2, a second conduit network 203 is provided to introduce a gaseous silane compound (e.g., $SiH_4$) into the reaction chamber at a time which is substantially simultaneous with the introduction of the selected gaseous mixture provided by first conduit network 201. Other suitable gaseous compounds include mono-silane, di-silane, and $Si_2F_6$-silane. In this embodiment, argon gas is fed into second conduit network 203 at a conduit segment 230 which leads to a mass flow controller 232. Mass flow controller 232 is configured to control the flow rate of the argon gas to a conduit segment 234 which leads to a valve 236.

As illustrated, a gaseous silane compound source 240 is coupled to a valve 242 and a mass flow controller 243 that may conduct the gaseous silane into a conduit segment 244, which leads to a conduit segment 238. At this stage, when valve 236 is allowed to conduct, argon gas will flow into conduit segment 238 which leads to a valve 246. In this manner, argon gas and silane gas may mix and flow through open valve 246. The gaseous mixture then flows into a conduit segment 248 which leads to an outlet B that is coupled to a reaction chamber that will be described with reference to FIG. 3.

Figure 3:
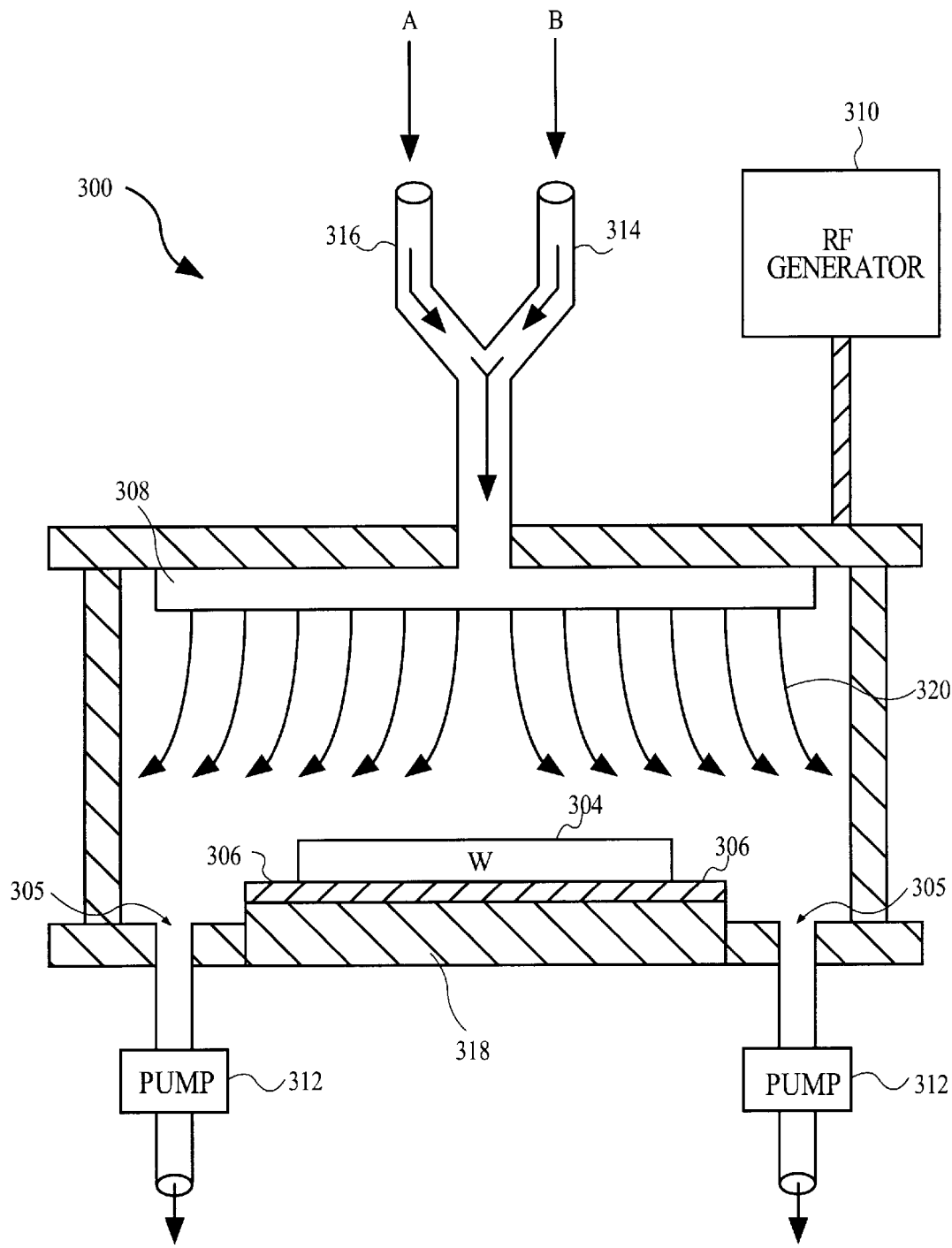
FIG. 3 is a diagrammatic illustration of a plasma enhanced chemical vapor deposition (PECVD) reaction chamber implemented in accordance with a preferred embodiment of this invention.

FIG. 3 is a diagrammatic illustration of a plasma enhanced chemical vapor deposition (PECVD) reaction chamber 300 in accordance with one embodiment of the present invention. As shown, a wafer 304 (e.g., any suitable semiconductor substrate), is placed in reaction chamber 300 on top of a support chuck 318 and an electrode plate 306. In this embodiment, wafer 304 may be partially fabricated having a previously deposited oxide film and a metal-one layer (not shown for ease of illustration). Reaction chamber 300 is further provided with a pair of inlet conduit segments 316 and 314, which are configured to receive gasses output from outlets A and B, respectively, of conduit network 201 and 203 of FIG. 2. In this manner, when the gas mixtures flow into inlet conduit segment 308 and 310, the in-flowing gasses are mixed in a conduit segment before entering a shower head 308. In this embodiment, shower head 308 is preferably a perforated-type electrode. In this manner, electrode plate 306 and shower head 308 form a parallel plate design having wafer 304 in between.

Reaction chamber 300 is further shown having vents 305 leading to pumps 312 which are configured to extract gaseous by-products not utilized to deposit the doped amorphous silicon layer over wafer 304. It should be appreciated that vents 305 may have any geometrical shape. By way of example, vents 305 may be cylindrical and surround chamber 300, and pump 312 may actually be a single vacuum pump unit. Although pumps 312 may be self contained within reaction chamber 300, one suitable pump is an Edwards Pump, Model No. D-25, which can be obtained from Edwards High Vacuum International of Wilmington, Mass. Of course, the exact vent and pump configuration typically depends upon the particular processing environments, chamber size, wafer size, etc.

The preferred pressure for reaction chamber 300 is preferably between about 3 and 5 Torr, and more preferably, between about 3.5 and 4.5 Torr, and optimally, about 4.0 Torr. Reactor chamber 300 is also shown powered by an RF generator 310 which is preferably configured to deliver power of between about 70 and 150 watts, and more preferably, between about 90 and 110 watts, and optimally, about 100 watts.

In one embodiment, the aforementioned electrodes are preferably designed to heat the wafer to a temperature of between about 370° C. and 430° C., and more preferably, between about 390° C. and 410° C., and optimally, about 400° C. Although any plasma enhanced CVD reaction chamber may be implemented to deposit the aforementioned gaseous mixtures, one suitable chamber, is a Precision 5000 available from Applied Materials, Inc., of Santa Clara, Calif.

In operation, once the electrodes have been heated reaction chamber 300 to an appropriate temperature, the gaseous mixtures described in FIG. 2 are channeled through inlet conduit segments 316 and 314 where they are mixed before entering shower head 308. Once the gaseous mixture is in shower head 308, the gaseous mixture is preferably evenly delivered into reaction chamber 300 as illustrated by flow lines 320. At this stage, reaction chamber 300 is preferably powered up and is at the target pressure for appropriately depositing a layer of "doped" amorphous silicon over wafer 304.

In one embodiment, the preferred flow rates for the various gaseous mixtures being channeled into reaction chamber 300 is as follows. For gaseous silane, between about 70 and 140 standard cubic centimeters per minute (sccm), and more preferably, between about 80 and 100 sccm, and most preferably about 90 sccm. When an n-doping amorphous silicon layer is desired, a preferable flow rate of phosphene ($PH_3$) is between about 5 and 10 sccm, and more preferably, between about 6 and 8 sccm. As described in FIG. 2, an inert carrier gas such as argon is used to provide both the gaseous silane compound and the n-type dopant gas. Therefore, the combined flow rate of argon gas entering reaction chamber 300 is preferably between about 1,450 and 2,100 sccm, and more preferably, between about 1,575 and 1,925 sccm, and most preferably, about 1,750 sccm.

On the other hand, if a p-doped amorphous silicon layer is desired, valve 220 and mass flow controller 219 of FIG. 2 will suspend the n-type gaseous flow, and a p-type dopant gas is allowed to flow through valve 212 and mass flow controller 213. In this manner, the p-type dopant gas and the gaseous argon gas combines as they flow to valve 226. In this embodiment, the preferred flow rate of the p-type dopant gas (e.g., diborane) is between about 10 and 80 sccm, and more preferably, between about 20 and 40 sccm, and most preferably, about 30 sccm. Further, as mentioned above, the combined flow rate of argon gas entering reaction chamber 300 is most preferably be about 1,750 sccm.

In the embodiment where an n-type doped amorphous silicon layer is desired, the preferred concentration of phosphene in reaction chamber 300 during deposition, is preferably between about 0.4% and 4.0%, and more preferably, between about 1.0% and 2.0%, and most preferably, about 1.5%. On the other hand, in the embodiment where a p-type doped amorphous silicon layer is desired, the concentration of diborane in the reaction chamber 300 during deposition, is preferably between about 0.5% and 4.0%, and more preferably, between about 1.0% and 2.0%, and most preferably, about 1.5%.

Once the appropriate flow rates and concentrations have been introduced into reaction chamber 300, the reaction chamber has been appropriately powered up, and the electrodes have been heated to an appropriate temperature, a "doped" amorphous silicon layer begins to form over wafer 304. Preferably, the dopant concentration of the resulting doped amorphous silicon layer is between about $1 \times 10^{12}$ and about $1 \times 10^{16}$ ions per centimeters squared, and more preferably between about $1 \times 10^{14}$ and about $1 \times 10^{15}$ ions per centimeters squared, and most preferably about $5 \times 10^{14}$ ions per centimeters squared.

Figure 4B:
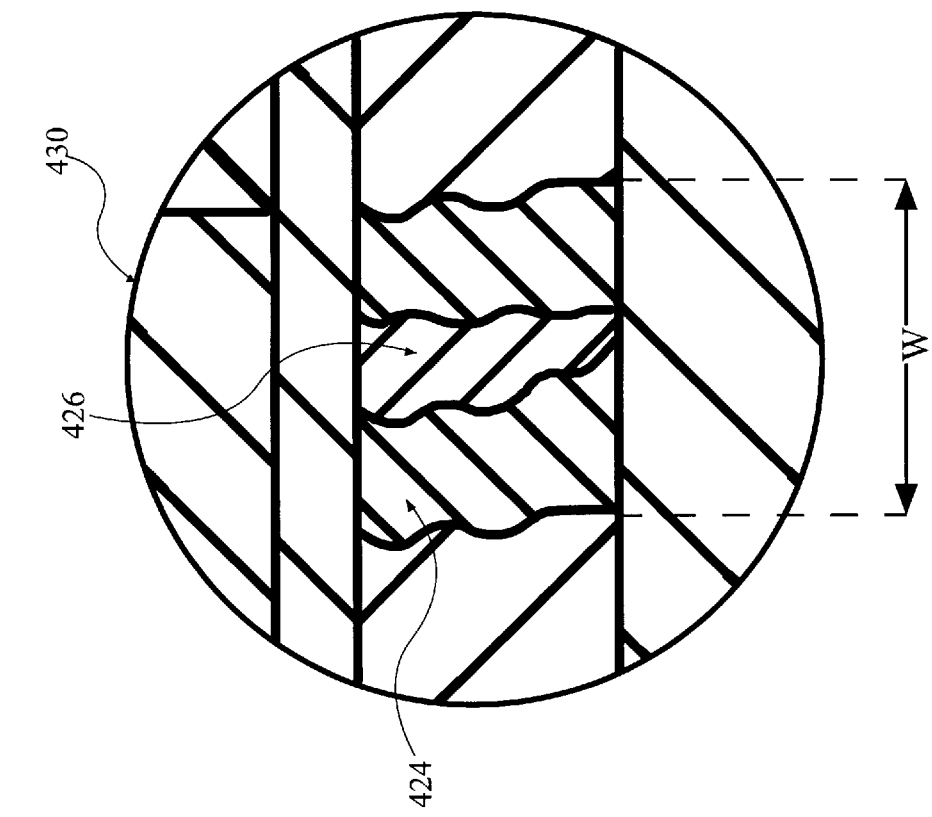
FIGS. 4A and 4B are cross-sectional perspectives of a doped antifuse structure after the application of a programming voltage in accordance with a preferred embodiment of this invention.
Figure 4A:
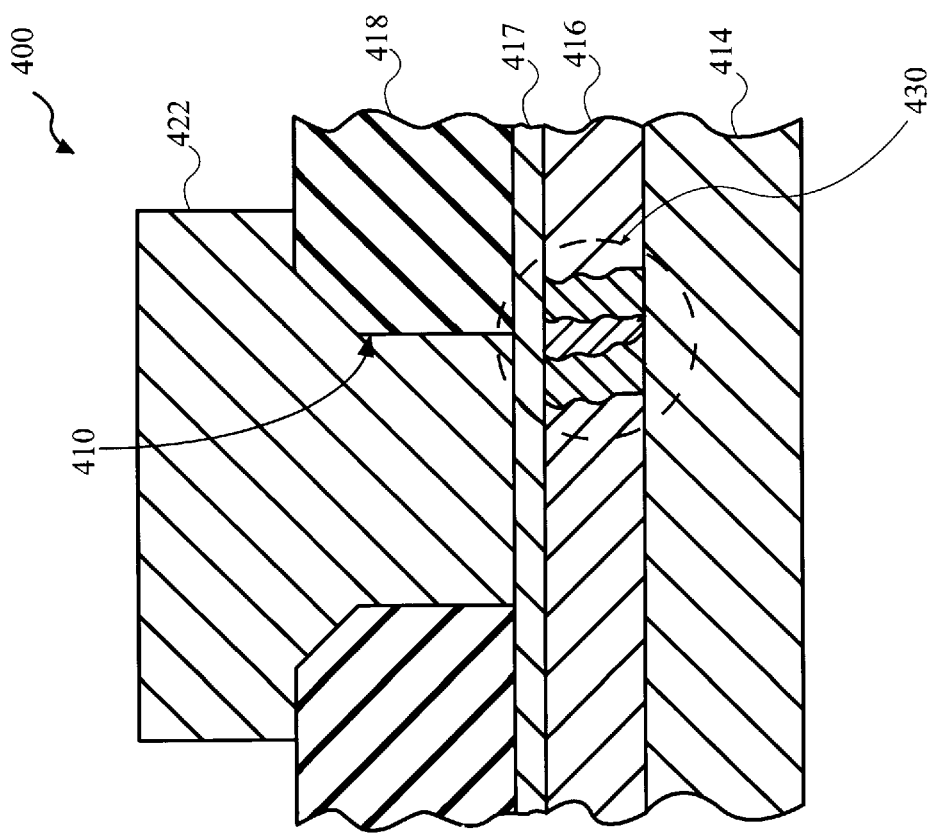

The deposition of a doped amorphous silicon layer may be further understood with reference to a programmed doped amorphous silicon antifuse structure illustrated in FIGS. 4A and 4B. In this embodiment, an antifuse structure 400 is shown having a bottom electrode 114 which is preferably formed by sputtering (e.g., PVD deposition) over a partially fabricated silicon wafer, such as silicon wafer 304 of FIG. 3. Bottom electrode 114 is made of any suitable conductive material. By way of example, bottom electrode 114 can be a titanium-tungsten/aluminum/titanium-tungsten sandwich (TiW—Al—TiW), and the TiW acting as a diffusion barrier to prevent aluminum atoms from diffusing into and degrading the subsequently deposited doped amorphous silicon layer. In one embodiment, the aluminum material is an aluminum-copper mix having approximately 99.5% aluminum and approximately 0.5% copper (and some silicon). Once bottom electrode 114 has been formed and patterned over wafer 304 (e.g., using conventional photolithography techniques), the wafer 304 is placed into reaction chamber 300 of FIG. 3 for depositing a doped amorphous silicon layer 116.

As mentioned above, the doped amorphous silicon layer may be either n-doped or p-doped, depending upon the dopant gases introduced into reaction chamber 300. In one embodiment, the deposition process is performed such that the doped amorphous silicon layer has a thickness of between about 400 Å and 2,000 Å, and more preferably, between about 700 Å and 1,400 Å, and most preferably about 1,000 Å. By way of example, it has been found that the preferred thickness of the doped amorphous silicon layer can be obtained by subjecting wafer 304 to the plasma-enhanced chemical vapor deposition process for between about 15 and 90 seconds and more preferably, between about 25 and 50 seconds, and most preferably about 40 seconds. Of course, the processing time may vary depending upon the specific thicknesses desired, and gaseous flow rates associated with other embodiments within the scope of this invention.

Once doped amorphous silicon layer 416 has been deposited over bottom electrode 414, a conductive barrier layer 417 is formed over doped amorphous silicon layer 416. Although any suitable barrier layer material such as titanium nitride (TiN), tungsten silicide ($WSi_2$), tantalum silicide ($TaSi_2$), tantalum silicon nitride (Ta—Si—N), etc. can be used, barrier layer 417 is preferably a titanium-tungsten (TiW) layer suited to protect the doped amorphous silicon layer 416 from contaminating materials that may be introduced during a subsequent via hole etch.

Once barrier layer 417 has been formed over doped amorphous silicon 416, an intermediate oxide (IMO) layer 418 is deposited over barrier layer 417. IMO layer 418 is preferably deposited to a thickness of between about 10,000 and 2,000 Å, and more preferably, about 5,000 Å. Next, a via hole mask (not shown for ease of illustration) is implemented to define a via hole 410 down to barrier layer 417. Once via hole 410 is defined, a top electrode 422 is deposited and etched to formed a conductive material filled down via hole 410 and in contact with barrier layer 417.

As is well known in the art, top electrode 422 can be any suitable electrode material for making electrical contact down to barrier layer 417. By way of example, top electrode 422 can be a tungsten plug, or an aluminum fill. Once antifuse structure 400 has been formed as shown in FIG. 4A, a programming voltage of between about 2 and 20 volts D.C., and a current magnitude of between about 1 and 40 mA, and more preferably, a programming voltage of about 10 volts D.C., and a current magnitude of about 20 mA is applied between bottom electrode 414 and top electrode 422. As illustrated, once antifuse structure 400 is programmed, a pair of conducting filaments are formed as magnified in FIG. 4B.

Referring now to FIG. 4B, magnification 130 shows a potential linking area in antifuse structure 400. By way of example, the selected impurities and concentrations used to deposit the doped amorphous silicon layer 416 advantageously enable the formation of a double conductive filament path. The first path is a doped polysilicon filament 424 (e.g., polycrystalline silicon) having a width W of between about 1,000 Å and 2,000 Å, and more preferably, about 1,500 Å. The second path is a silicide filament 426 which is believed to be formed by the electromigration of barrier layer (TiW) conductive material onto the doped amorphous silicon layer 416 during programming.

In this embodiment, doped polysilicon filament 424 preferably surrounds silicide filament 426. By way of example, both filaments may be viewed as cylindrical conductive paths wherein silicide filament 426 is located within doped polysilicon filament 424. In this embodiment, the doped nature of the amorphous silicon layer 416 will advantageously contribute to the expanded diameter of conductive path 424. In this manner, the expanded conductive path may enable more stable and reliable antifuse programming (e.g., preventing "infant mortality" failures).

Figure 5:
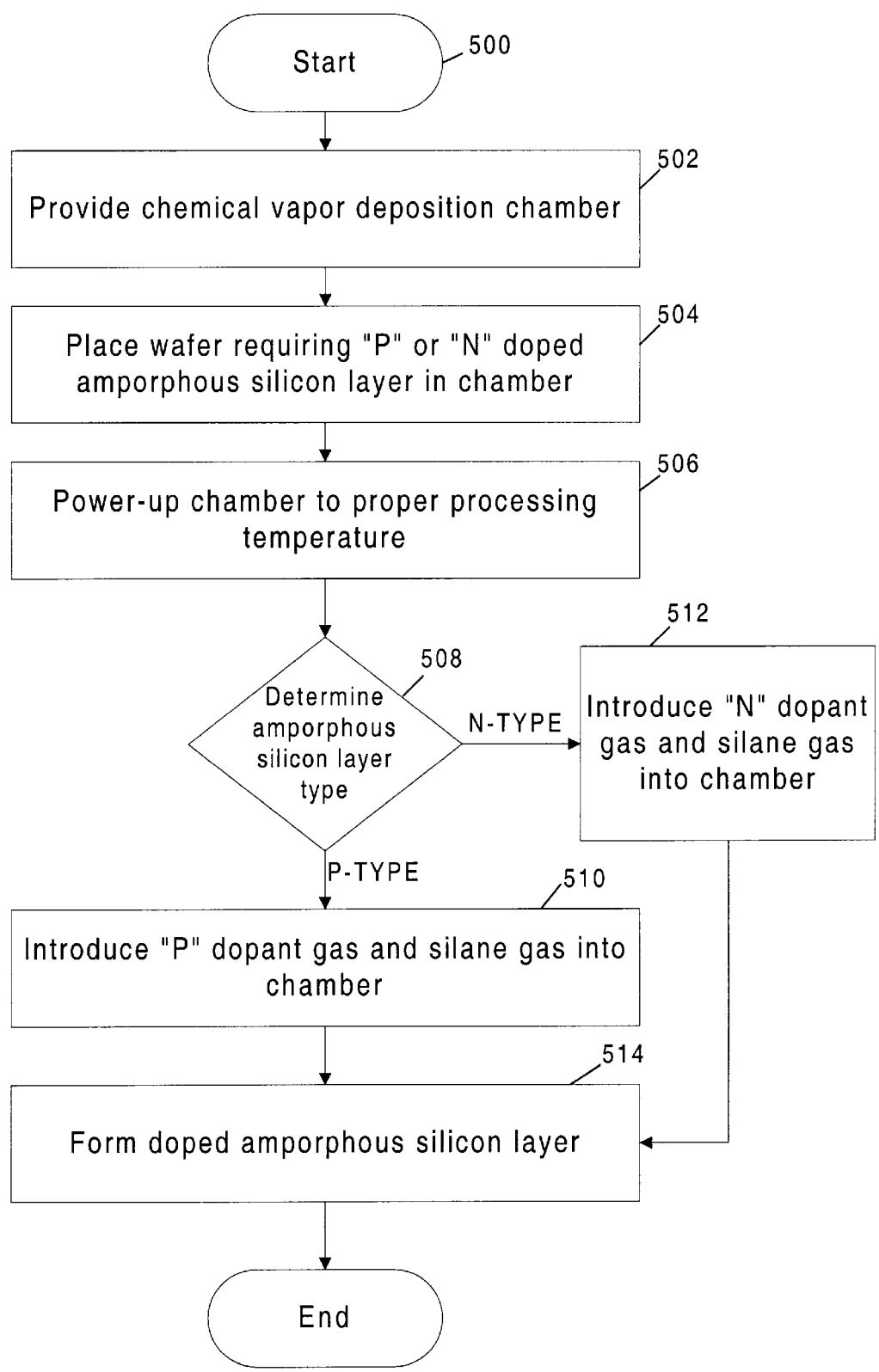
FIG. 5 is a flow chart representation of the steps associated with depositing doped amorphous silicon antifuse layer in accordance with a preferred embodiment of this invention.

The above-described embodiments may be further understood with reference to a flow chart presented in FIG. 5. The flow chart of FIG. 5 illustrates the method steps associated with forming "doped" amorphous silicon layers in accordance with one embodiment of the present invention. The method starts at a step 500. From step 500, the method proceeds to a step 502, where a chemical vapor deposition chamber is provided. By way of example, the reaction chamber may be a PECVD reaction chamber as described above.

From step 502, the method proceeds to a step 504, where a wafer requiring an amorphous silicon layer is placed in reaction chamber 300 of FIG. 3. In this embodiment, any suitable semiconductor wafer may be placed in the reaction chamber 300, and preferably, a wafer having approximately six-inches in diameter is secured to electrode 306 and support chuck 318 of FIG. 3.

The method then proceeds to a step 506 where the chamber is "powered up" to the appropriate processing temperature and pressure. By way of example, the temperature of the electrodes may be between about 370° C. and 430° C., and more preferably, between about 390° C. and 410° C. Further, as mentioned above, the preferred pressure may be set to between about 3 and 5 Torr, and more preferably, between about 3.5 and 4.5 Torr.

Once the appropriate temperature and pressure is set, the method will proceed to a step 508 where a decision is made as to the type of doped amorphous silicon layer desired. If an n-type doped amorphous silicon layer is desired, the method will proceed to a step 512 where an n-type dopant gas (e.g., phosphene, Arsine, etc.) and a silane gas is introduced into the reaction chamber with the aid of an inert carrier gas. If a p-type doped amorphous silicon layer is desired, the method will proceed to a step 510 where a p-type dopant gas (e.g., diborane, $BF_2$, etc.) and a silane gas is introduced into the reaction chamber with the aid of an inert carrier gas. In this embodiment, the inert carrier gas-is argon, although it should be understood that any suitable inert gas may be substituted therefor.

Once the gaseous mixtures have been introduced into reaction chamber 300 for either a p-type or an n-type doped amorphous silicon deposition, the method will proceed to a step 514 where the formation of the doped amorphous silicon layer begins. By way of example, the deposition may proceed for between about 15 and 90 seconds, and more preferably, between about 25 and 50 seconds. In this manner, the thickness of the doped amorphous silicon layer may be between about 400 Å and 2,000 Å.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A method for making an antifuse structure comprising:

forming a bottom electrode over a supporting substrate;

depositing a doped antifuse material over said bottom electrode in electrical communication therewith, said antifuse material being doped with at least one of a positive dopant species and a negative dopant species to a dopant level of between about $1 \times 10^{12}$ ions per centimeters squared and about $1 \times 10^{16}$ ions per centimeters squared;

forming a top electrode over said doped antifuse material in electrical contact therewith;

applying a programming voltage between said bottom electrode and said top electrode to cause a reduction in electrical resistance between said bottom electrode and said top electrode due to a programming of said doped antifuse material; and forming a double conductive filament path through said doped antifuse material to establish said reduction in electrical resistance between said bottom electrode and said top electrode.

2. A method for making an antifuse structure as recited in claim 1, wherein the antifuse material is amorphous silicon, and said forming of said double conductive filament path further includes:

forming a doped polysilicon filament; and forming a silicided filament.

3. A method for making an antifuse structure as recited in claim 1, wherein the positive species is Boron.

4. A method for making an antifuse structure as recited in claim 1, wherein the negative species is selected from the group consisting of Phosphorous and Arsenic.

5. A method for making an antifuse structure as recited in claim 1, wherein the doped antifuse material is deposited from a gaseous mixture.

6. A method for making an antifuse structure as recited in claim 5, wherein the gaseous mixture includes a neutral species selected from the group of Ar, N, $O_2$, and He, and a silane compound gas selected from the group consisting of mono-silane, di-silane, and $Si_2F_6$-silane.

7. A method for making an antifuse structure as recited in claim 5, wherein the gaseous mixture includes a p-type gas selected from the group consisting of $B_2H_6$ and $BF_2$.

8. A method for making an antifuse structure as recited in claim 5, wherein the gaseous mixture includes an n-type dopant selected from the group consisting of $PH_3$ and Arsine.

9. A method for depositing an antifuse layer to form part of an antifuse structure including a lower electrode, a barrier layer formed over the antifuse layer, and an upper electrode, the method comprising the steps of:

providing a chemical vapor deposition reactor having a support for supporting a silicon wafer;

powering up the chemical vapor deposition reactor thereby heating the silicon wafer; and introducing a gaseous mixture of a silane compound, and a selected dopant species, and a neutral species into the chemical vapor deposition reactor thereby causing the deposition of an antifuse layer;

wherein the antifuse layer is capable of receiving a voltage delivered between the upper electrode and the lower electrode which generates a double conductive filament path through the antifuse layer, the double conductive filament is configured to establish a reduction in electrical resistance between the upper electrode and the lower electrode.

10. The method for depositing an antifuse layer as recited in claim 9, wherein the neutral species is selected from the group consisting essentially of argon, nitrogen and helium, or a combination thereof.

11. The method for depositing an antifuse layer as recited in claim 9, wherein the dopant species is one of an n-type dopant and a p-type dopant.

12. The method for depositing an antifuse layer as recited in claim 11, wherein the n-type dopant is selected from the group consisting of $PH_3$ and Arsine.

13. The method for depositing an antifuse layer as recited in claim 11, wherein the p-type dopant is selected from the group consisting essentially of $B_2H_6$ and $BF_2$.

14. The method for depositing an antifuse layer as recited in claim 9, wherein the silane compound is selected from the group consisting essentially of mono-silane, di-silane, and $Si_2F_6$-silane.

15. The method for depositing an antifuse layer as recited in claim 9, wherein said amorphous silicon layer is deposited to a thickness of between about 400 Å and 2000 Å.

16. The method for depositing an antifuse layer as recited in claim 9, further comprising the step of:
    forming a dielectric layer over said barrier layer having a thickness of between about 2,000 Å and 10,000 Å;
    forming a via hole though the dielectric layer; and
    depositing a conductive material in said via hole such that the conductive material is in electrical contact with the barrier layer.

17. The method for depositing an antifuse layer as recited in claim 9, wherein the step of heating the partially fabricated silicon wafer is performed by increasing the temperature of said support chuck.

18. The method for depositing an antifuse layer as recited in claim 9, wherein the partially fabricated silicon wafer may be between about 4 inches and 8 inches in diameter.

19. The method for depositing an antifuse layer as recited in claim 9, wherein the step of powering up requires delivering between about 70–150 watts to said chemical vapor deposition reactor.

20. The method for depositing an antifuse layer as recited in claim 9, wherein the chemical vapor deposition reactor temperature is set to between about 370° C. and 430° C. during deposition.

21. The method for depositing an antifuse layer as recited in claim 9, wherein the method further includes providing a substrate having a plurality of logic devices arranged therein.

22. A method or making an antifuse structure, comprising:
    forming a bottom electrode over a supporting substrate;
    depositing a doped antifuse material in a chemical vapor deposition chamber to form said doped antifuse material over said bottom electrode in electrical communication therewith, said antifuse material being doped with at least one of a positive dopant species and a negative dopant species to a dopant level of between about $1\times10^{12}$ ions per centimeters squared and about $1\times10^{16}$ ions per centimeters squared, and said depositing includes,
    applying a dose of gaseous silane of between about 70 standard cubic centimeters per minute and about 140 standard cubic centimeters per minute into said chemical vapor deposition chamber;
    continuing said depositing for a time of between about 15 seconds and about 90 seconds to increase a thickness of said doped antifuse material to a range between about 400 Å and 1,400 Å;
    forming a top electrode over said doped antifuse material in electrical contact therewith;
    applying a programming voltage between said bottom electrode and said top electrode; and
    forming a double conductive filament path through said doped antifuse material to establish a reduction in electrical resistance between said bottom electrode and said top electrode.

23. A method for making an antifuse structure as recited in claim 22, further comprising:
    injecting said positive dopant species into said chemical vapor deposition chamber at a flow rate of between about 10 sccm and about 80 sccm, wherein said positive dopant species is diborane.

24. A method for making an antifuse structure as recited in claim 22, further comprising:
    injecting said negative dopant species into said chemical vapor deposition chamber at a flow rate of between about 5 sccm and about 10 sccm, wherein said negative dopant species is phosphene.

25. A method for making an antifuse structure as recited in claim 22, wherein the antifuse material is amorphous silicon, and said forming of said double conductive filament path further includes:
    forming a doped polysilicon filament; and
    forming a silicided filament.

26. A method of manufacturing an antifuse structure comprising:
    forming a bottom electrode over a supporting substrate;
    depositing a doped antifuse material in a chemical vapor deposition chamber to form said doped antifuse material over said bottom electrode in electrical communication therewith, said antifuse material being doped with at least one of a positive dopant species and a negative dopant species to a dopant level of between about $1\times10^{12}$ ions per centimeters squared and about $1\times10^{16}$ ions per centimeters squared, and said depositing includes,
    applying a dose of gaseous silane of between about 70 standard cubic centimeters per minute and about 140 standard cubic centimeters per minute into said chemical vapor deposition chamber;
    forming a top electrode over said doped antifuse material in electrical contact therewith; and
    applying a programming voltage between said bottom electrode and said top electrode to cause a programming of said antifuse structure, the applying configured to form a doped polysilicon filament in the doped antifuse material and at least one silicided filament within the doped polysilicon filament.

27. A method of manufacturing an antifuse structure as recited in claim 26, further comprising:
    injecting said positive dopant species into said chemical vapor deposition chamber at a flow rate of between about 10 sccm and about 80 sccm, wherein said positive dopant species is diborane.

28. A method of manufacturing an antifuse structure as recited in claim 26, further comprising:
    injecting said negative dopant species into said chemical vapor deposition chamber at a flow rate of between about 5 sccm and about 10 sccm, wherein said negative dopant species is phosphene.

29. A method of manufacturing an antifuse structure as recited in claim 26, wherein the antifuse material is amorphous silicon, and said forming of said double conductive filament path further includes:

forming a doped polysilicon filament; and forming a silicided filament.

30. A method of manufacturing an antifuse structure as recited in claim 27, further comprising:

powering up said chemical vapor deposition chamber to between about 70–150 watts after the injecting of the positive dopant species and the applying a dose of gaseous silane.

31. A method of manufacturing an antifuse structure as recited in claim 28, further comprising:

powering up said chemical vapor deposition chamber to between about 70–150 watts after the injecting of the negative dopant species and the applying a dose of gaseous silane.

* * * * *